United States Patent [19]
Sakatani et al.

[11] Patent Number: 5,804,513
[45] Date of Patent: Sep. 8, 1998

[54] ABRASIVE COMPOSITION AND USE OF THE SAME

[75] Inventors: Yoshiaki Sakatani; Kazumasa Ueda; Yoshiaki Takeuchi, all of Niihama, Japan

[73] Assignee: Sumitomo Chemical Company, Ltd., Osaka, Japan

[21] Appl. No.: 919,813

[22] Filed: Aug. 29, 1997

[30] Foreign Application Priority Data

Aug. 29, 1996 [JP] Japan ..................................... 8-228186

[51] Int. Cl.$^6$ ....................................................... C09G 1/02
[52] U.S. Cl. .............................. 438/693; 51/308; 51/309; 106/3; 216/89
[58] Field of Search .................................. 106/3; 51/308, 51/309; 252/79.1; 438/692, 693; 216/89

[56] References Cited

U.S. PATENT DOCUMENTS

| | | | |
|---|---|---|---|
| 3,429,080 | 2/1969 | Lachapelle | 51/309 |
| 4,331,565 | 5/1982 | Schaefer et al. | 252/462 |
| 4,475,981 | 10/1984 | Rea | 156/636 |
| 4,881,951 | 11/1989 | Wood et al. | 51/309 |
| 4,956,313 | 9/1990 | Cote et al. | 437/203 |
| 4,959,113 | 9/1990 | Roberts | 156/636 |
| 5,209,816 | 5/1993 | Yu et al. | 156/636 |
| 5,232,875 | 8/1993 | Tuttle et al. | 438/693 |
| 5,244,534 | 9/1993 | Yu et al. | 156/636 |
| 5,340,370 | 8/1994 | Cadien et al. | 51/308 |
| 5,527,423 | 6/1996 | Neville et al. | 438/693 |

FOREIGN PATENT DOCUMENTS

| | | |
|---|---|---|
| 0745656 | 12/1996 | European Pat. Off. . |
| 56-026547A | 3/1981 | Japan . |
| 62-083315A | 4/1987 | Japan . |
| 05220394A | 8/1993 | Japan . |
| 9322103 | 11/1993 | WIPO . |

OTHER PUBLICATIONS

Kumar et al., Materials Research Bulletin, vol. 29, No. 5, pp. 551–558 (1994).
Ozawa et al., J. Materials Science Letters, vol. 9, pp. 709–711 (1990).
Ozawa et al., J. Materials Science Letters, vol. 9, pp. 291–293 (1990).
Ozawa et al., Funtai Oyobi Funmatuyakin, vol. 37, No. 3, pp. 466–473 (1989).
F. B. Kaufman, Journal of the Electrochemical Society, 138(11):3460–3465 (1991) no month.
R. Jairath et al., Proceedings of the SPIE, 2090:103–110 (1993).
R. Mattox, Extended Abstracts, 93/2:291–292 (1993).
R. Jairath et al., Mat. Res. Soc. Symp. Proc., 337:121–131 (1994).

Primary Examiner—Deborah Jones
Attorney, Agent, or Firm—Birch, Stewart, Kolasch & Birch, LLP

[57] ABSTRACT

An abrasive composition is provided comprising an oxidizing agent and abrasive particles which have a mean particle size of 2 μm or less, wherein each of the abrasive particles comprises (i) at least one oxide selected from aluminum oxide and silicon oxide and (ii) cerium oxide in an amount of 5% to 40% by weight in terms of cerium based on the oxide (i). A method for polishing and planarizing a metal layer formed on a semiconductor substrate using the abrasive composition is also provided.

14 Claims, 2 Drawing Sheets

1. a semiconductor substrate
2. an insulating layer
3. a metal contact layer
4. an adhesion layer
5. a metal layer for wiring FIG 1  polishing apparatus using the CMP method
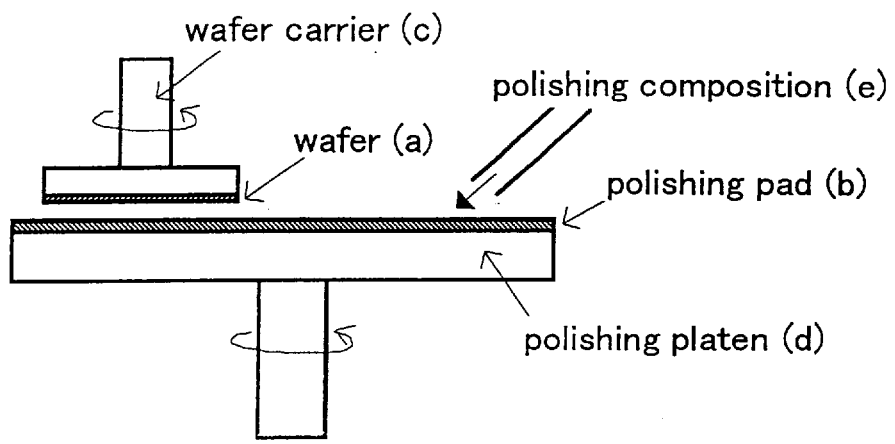

1. a semiconductor substrate
2. an insulating layer
3. a metal contact layer
4. an adhesion layer
5. a metal layer for wiring 3.2

ABRASIVE COMPOSITION AND USE OF THE SAME

FIELD OF THE INVENTION

The present invention relates to an abrasive composition, and a method of polishing and planarizing a metal layer formed on a semiconductor substrate using the abrasive composition.

BACKGROUND OF THE INVENTION

With extensive development of LSI techniques, integrated circuits have further been micronized and multilayer interconnected circuits have been frequently made. The multilayer interconnection of an integrated circuit enlarges unevenness on the surface of a semiconductor and the presence of the unevenness causes breaks in the printing and local increases in the resistance. And further in conjunction with the micronization of integrated circuits, the presence of the unevenness brings about a wire breaking, current capacity decrease and an occurrence of electromigration.

Therefore, a planarizing technique which planarizes a metal wiring and an interlayer insulating layer of a multilayer interconnected substrate and which decreases an unevenness between layers is required. Various planarizing processing techniques have been developed, and one of them is a chemical mechanical polishing technique (CMP method). This technique is used for the planarizing of an interlayer insulating layer, the formation of embedded wirings in the board and plug formation in production of semiconductors.

BRIEF DESCRIPTION OF THE DRAWINGS

FIG. 1 shows a schematic view of a polishing apparatus using the CMP method.

FIG. 1 shows a schematic view of a polishing apparatus using the CMP method. The polishing is conducted as follows. That is, usually, a flat wafer (a) comprising a semiconductor material is kept on a wafer carrier (c) while introducing constant suction to the wafer carrier (c) in order to keep the wafer (a) attached to the wafer carrier (c). And a polishing platen (d) which supports a polishing pad (b) and the wafer carrier (c) which supports the wafer (a) are respectively rotated in the same directions as shown by the arrows for conducting the polishing. In this process, protruding parts of the insulating layer and the wiring are polished and planarized by a polishing composition introduced between the wafer and polishing pad. The properties of materials and additives in the polishing composition and the particle size of the abrasive particles in the polishing composition exert serious influence on the polishing rate and surface condition of the polished surface.

FIG. 2 shows one example for forming an embedded metal wiring board using the CMP method. FIG. 2 (A) to (E) are all sectional views and show only metal wiring parts.

First, as shown in Fig (A), an insulating layer 2 is formed on a semiconductor substrate 1 such as a silicon substrate, and the resulting insulating layer 2 is polished and planarized using an abrasive composition. A composition obtained by mixing a colloidal silica with an alkaline component such as potassium hydroxide or a composition containing cerium oxide is usually used as the abrasive composition for an insulating layer.

Figure 2A:
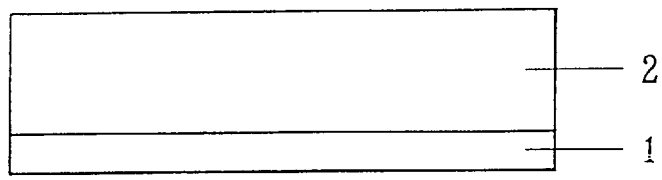
FIG. 2(A)–(E) are sectional views showing metal wiring parts.
Figure 2B:
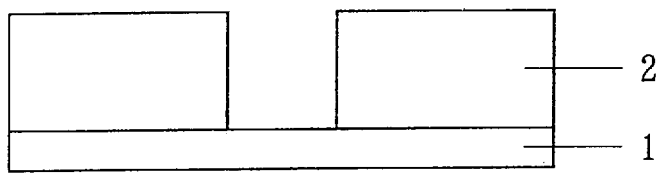
Figure 2C:
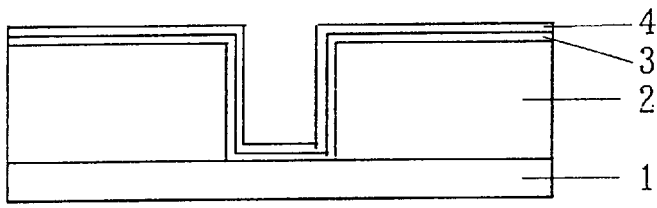
Figure 2D:
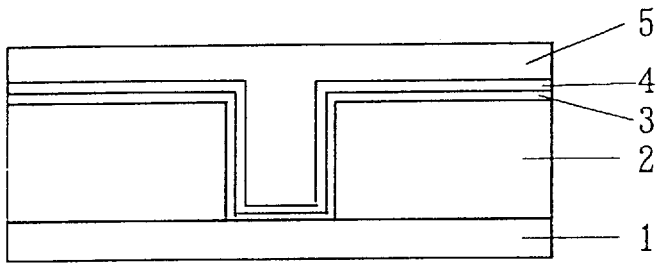
Figure 2E:
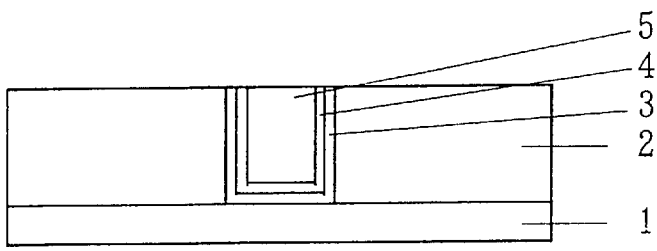

As shown in FIG. 2 (B), slits for metal wiring or openings for connecting wiring are formed in the insulating layer 2 by a photolithography method and etching method.

Next, as shown in FIG. 2 (C), a 'metal contact layer' 3 such as a titanium layer and an adhesion layer 4 such as a titanium nitride layer are formed on the slits or openings in the insulating layer 2 by methods such as sputtering, or a chemical vapor deposition (CVD) method, so that no mutual diffusion or reaction occur between the insulating layer 2 and 'metal layer for wiring' 5.

Next, as shown in FIG. 2 (D), the 'metal layer for wiring' 5 is embedded in the slits or openings formed in the insulating layer 2 by methods such as sputtering or CVD method, so that the thickness thereof is greater than the depth of the slits or openings formed in the insulating layer 2. As for the metal layer 5, a tungsten layer, an aluminum layer or a copper layer is generally used.

Next, as shown in FIG. 2 (E), surplus components of the metal layer 3, 5 and the adhesion layer 4 other than the components among the slits and openings are removed by polishing.

For polishing the metal layers 3, 5 and the adhesion layer 4, an abrasive composition, which comprises an abrasive particle such as aluminum oxide or silicon oxide and an oxidizing agent such as hydrogen peroxide is usually used.

When the abrasive particle for polishing the metal layers 3, 5 and the adhesion layer 4 is aluminum oxide, for example, aluminum oxide of which crystalline form is α-type has high hardness and manifests high polishing rate, but such aluminum oxide produces the disadvantages that defects such as micro scratches and orange peel effects are formed on the surface of the metal layer 5 and the insulating layer 2. Alternatively, when the abrasive particle is transition alumina such as γ-type aluminum oxide, amorphous aluminum oxide or silicon oxide, which has lower hardness than the α-type, the abrasive particle can suppress the forming of defects such as micro scratches and orange peel effects on the surface of the metal layer 5 and the insulating layer 2, but it causes the disadvantage that sufficient polishing rate can not be obtained in polishing the metal layers 3, 5 and the adhesion layer 4.

Also, it is known to use cerium oxide as an abrasive particle for the insulating layer 2. However, it is said that cerium oxide is not suitable for polishing of the metal layers 3, 5 and the adhesion layer 4 on a semiconductor substrate, since the insulating layer 2 is unnecessarily polished on the completion of polishing and planarizing of the insulating layer 2 is lost and defects such as micro scratches and orange peel effects are caused on the insulating layer 2. Further, cerium oxide of which purity is low contains a radioactive isotope as impurities, therefore, when such cerium oxide is used as an abrasive particle, there is a problem that soft error is caused by α-ray radiated from the contained radioactive isotope if it remains on the device. On the other hand, high-purity cerium oxide without such impurities is very expensive and it is difficult to industrially apply the high-purity cerium oxide as an abrasive particle because of the cost.

As described above, when polishing is conducted using the conventional polishing composition for planarizing a metal layer on a semiconductor substrate in a process for producing a semiconductor, there are problems that defects occur on the polished surface, polishing rate is slow, polishing selectivity against a metal layer and an insulating layer is low, impurities which radiate α-ray remain. On the contrary, the present invention provides an abrasive composition which can be used as a polishing composition which is inexpensive, which provides for high polishing rate without causing defects on a metal layer formed on a semiconductor substrate, which is excellent in polishing selectivity against the metal layers and the insulating layer, which does not cause defects on the surface of the insulating layer, which avoids α-ray radiation and which can planarize the surface of a semiconductor substrate by polishing. The present invention also provides a method for polishing and planarizing of a metal layer formed on a semiconductor substrate using said abrasive composition.

SUMMARY OF THE INVENTION

The present invention provides an abrasive composition comprising an oxidizing agent and abrasive particles which have a mean particle size of 2 μm or less, wherein each of the abrasive particles comprises (i) at least one oxide selected from aluminum oxide and silicon oxide and (ii) cerium oxide in an amount of 5 to 40% by weight in terms of cerium based on the oxide (i).

The present invention also provides a method for polishing and planarizing a metal layer formed on a semiconductor substrate using the abrasive composition comprising an oxidizing agent and abrasive particles which have a mean particle size of 2 μm or less, wherein each of the abrasive particles comprises (i) at least one oxide selected from aluminum oxide and silicon oxide and (ii) cerium oxide in an amount of 5 to 40% by weight in terms of cerium based on the oxide (i).

DETAILED DESCRIPTION OF THE INVENTION

The abrasive composition of the present invention comprises an oxidizing agent and an abrasive particle which comprises an oxide (i) selected from aluminum oxide and silicon oxide, and for example, can be used as a polishing composition for polishing and planarizing a metal layer formed on a semiconductor substrate.

The abrasive particles of the present invention comprise cerium oxide and an oxide (i) selected from aluminum oxide and silicon oxide, and have a mean particle size of secondary particles measured by a light scattering method (e.g. micro track method) of 2 μm or less, preferably about 0.1 μm to 1.5 μm.

The content of cerium oxide of a secondary particle is about 5% by weight to about 40% by weight, preferably about 8% by weight to about 30% by weight in terms of cerium based on the oxide (i).

When the content of cerium oxide of a secondary particle is less than about 5% by weight in terms of cerium based on the oxide (i) and such particles are used in the polishing composition, the desired effect of improving the polishing rate can not be obtained. On the other hand, even if the content of cerium oxide of a secondary particle based on the oxide (i) is more than 40% by weight, the polishing rate is only saturated, and consequently production cost increases.

In the present invention, cerium oxide may be present in the oxide (i) or anchored on the oxide (i), or may cover the surface of the oxide (i). However, cerium oxide is not merely mixed with the oxide (i). If the oxide (i) and cerium oxide are merely mixed and used for the abrasive composition, it is almost impossible to increase the polishing rate.

The abrasive composition of the present invention is usually used in the form of a slurry and pH thereof is preferably about 7 or less, and more preferably about 5 or less. When pH is over about 7, the surface appearance of a metal layer after polishing is not so good.

Though this pH depends on the kind and amount of an oxidizing agent added, it can be suitably prepared by adding acid and/or alkali components in the pH range in which the above-mentioned oxidizing agent is stable.

The abrasive composition of the present invention contains an oxidizing agent, therefore, can polish the surface of a polishing-resistant metal layer with oxidizing the surface by the aid of the agent and can increase the polishing rate. Examples of the oxidizing agent used include known oxidizing agents such as hydrogen peroxide, iron (III) nitrate, iodic acid, iodate, perchloric acid and perchlorate. Examples of the preferred oxidizing agent include hydrogen peroxide and iron (III) nitrate.

The oxidizing agent is preferably used in an amount of about 0.5% by weight to about 15% by weight or of about 0.5% by volume to about 15% by volume based on the abrasive composition. The time when the oxidizing agent is added to the abrasive composition is not particularly limited if the oxidizing agent does not change its property, and preferably, the oxidizing agent is added immediately before polishing.

The BET specific surface area of the abrasive particle of the present invention is preferably from about 40 $m^2/g$ to about 150 $m^2/g$, more preferably from about 50 $m^2/g$ to about 130 $m^2/g$. When the BET specific surface area is less than about 40 $m^2/g$, the particle size of the primary particles tends to be enlarged and defects such as scratches and orange peel effects are liable to be caused on the polished surface. On the other hand, when the BET specific surface area of an abrasive particle is more than about 150 $m^2/g$, the polishing rate does not sufficiently increase since such abrasive particle has lower crystallinity than that of an abrasive particle having a BET specific surface area of not more than about 150 $m^2/g$.

In the present invention, when aluminum oxide is used as the oxide (i), an aluminum oxide of which crystalline form is transition alumina or amorphous aluminum oxide is preferably used. When α-type aluminum oxide is used, defects tend to occur on the polished surface.

As a method for producing the abrasive particles of the present invention, the following method is listed: First, 100 parts by weight of at least one compound selected from aluminum oxide having a mean particle size of secondary particles of not more than about 2 μm, silicon oxide having a mean particle size of secondary particles of not more than about 2 μm, and an aluminum oxide precursor or a silicon oxide precursor which is converted to aluminum oxide or silicon oxide having a mean particle size of secondary particles of not more than about 2 μm by calcination is suspended in a solvent to prepare suspension. Next, a cerium compound which is converted to cerium oxide by calcination is mixed with said suspension in an amount of about 5 parts by weight to about 40 parts by weight, preferably of about 8 parts by weight to about 30 parts by weight in terms of cerium after calcination to prepare a mixture. Next, said mixture is dried and then the dried mixture is calcined.

As the solvent used for preparing the above-mentioned suspension, there are listed water and alcohol, for example, methyl alcohol, ethyl alcohol or isopropyl alcohol.

Examples of the above-mentioned oxide precursors include compounds of aluminum or silicon such as their hydroxides, nitrates, acetates, sulfates, oxalates, ammonium salts and carbonates. Among these, the hydroxides are preferred.

Known methods can be used as the method for producing aluminum or silicon oxide having a mean particle size of not more than about 2 μm or for producing the precursors which are converted to aluminum or silicon oxide by calcination.

Examples thereof include an alkoxide method in which an aluminum or silicon alkoxide (for example, aluminum isopropoxide, aluminum ethoxide, aluminum n-isopropoxide or aluminum n-butoxide) is hydrolyzed in alcohol, and a vapor phase method in which a compound such as an aluminum halide or silicon halide (for example, aluminum chloride, aluminum bromide, aluminum iodide, silicon chloride, silicon bromide or silicon iodide) is vaporized, and hydrolyzed by calcining in an oxygen hydrogen flame. The oxide obtained by these methods comprises secondary particles having a particle size of 2 μm or less which are generally formed by aggregation of primary particles having a mean particle size of about 0.01 μm to about 0.2 μm.

The cerium compound which is used in the present invention is not particularly restricted, and is preferably a cerium compound of which valence is III or IV and which is dissolved or uniformly dispersed in a solvent in which the oxide (i) or the precursor which is converted to the oxide (i) by calcination is suspended. Examples thereof include cerium salts such as cerium nitrate, cerium acetate, cerium sulfate, cerium chloride, cerium oxalate, cerium carbonate, cerium ammonium sulfate and cerium nitrate such as cerium ammonium nitrate. Examples of the preferable cerium salts include cerium nitrate, cerium acetate, cerium sulfate and cerium chloride.

The abrasive particles of the present invention can be produced by a method which comprises suspending the oxide (i) or the precursor in a solvent wherein the precursor is able to be converted to the oxide (i) by calcination, to prepare a suspension, mixing a cerium compound with the suspension, removing the solvent, drying the suspension and calcining it at about 600° C. to about 1100° C. for one minute or more, preferably about 10 minutes to about 5 hours. When the above-mentioned suspension is dried, the dryer used is not particularly restricted, and a flash dryer or air flow dryer is preferably used to obtain a minute dried powder which tends not to agglomerate.

When the calcining temperature is lower than about 600° C., the cerium compound is not completely converted to cerium oxide, and when over about 1100° C., the particle size becomes too large and α-alumina is formed, which can cause defects on the polished surface if used in an abrasive composition.

Further, when aluminum oxide is used as the oxide (i) in the present invention, it is preferable to conduct calcining so that the crystalline form of aluminum oxide after calcination is mainly transition alumina such as γ-alumina, amorphous alumina or a mixture thereof. To do so, it is preferable to adopt the above-mentioned calcining temperature and time as calcining conditions.

A calcining apparatus is not particularly restricted in the present invention, and there can be used known calcining furnaces such as a rotary kiln, a flash calcining furnace, a pacing-type calcining furnace, a fluidized calcining furnace, a tunnel furnace, a vacuum furnace or a shuttle furnace. In general, from the viewpoint of productivity and heat resistance of a material of the furnaces, the rotary kiln, tunnel furnace and shuttle furnace are preferred.

The observation by a transmission electron microscope of surface of the oxide (i) containing cerium oxide in the present invention obtained in the above-mentioned method reveals that the surface is in any condition selected from a condition in which the whole surface of the oxide (i) is coated with cerium oxide, a condition in which a part of the surface of the oxide (i) is coated with cerium oxide and a condition in which cerium oxide is contained in particles of the oxide (i). The mean particle size of the oxide (i) containing cerium oxide is not more than about 2 μm, preferably from about 0.2 to about 1.5 μm.

The abrasive composition of the present invention can be used for polishing and planarizing a metal layer on a semiconductor substrate, and can be used in the form of a slurry dispersed in water.

For forming the slurry, an abrasive particle, oxidizing agent and water may be mixed simultaneously and be dispersed, and any component may be mixed successively in any order to previously prepare the slurry. That is, an abrasive particle and water, an abrasive particle and oxidizing agent, an oxidizing agent and water may respectively be mixed, and when used for polishing, remaining one component, namely the oxidizing agent, water and an abrasive particle respectively may be mixed and be dispersed to obtain a slurry to be used.

To disperse these components to obtain the slurry, for example, dispersing methods using a homogenizer, ultrasonic disperser or wet atmosphere agitation mill may be used.

The content of abrasive particles based on the slurry, namely the slurry concentration is usually about 1% to about 30% by weight.

The abrasive particles of the present invention can contain water as mentioned before.

Additives such as a dispersing agent, precipitation inhibitor or defoaming agent may optionally be added to the abrasive composition of the present invention and the resulting mixture may be used for a polishing composition.

The abrasive composition of the present invention thus prepared in the form of a slurry can be used, for example, for polishing and planarizing of a metal layer on a semiconductor substrate. In this case, the abrasive composition in the form of a slurry has pH usually of about 7 or less, preferably about 5 or less.

The metal layer on a semiconductor substrate which is an object to be polished is not particularly restricted, and examples thereof include tungsten W, aluminum Al, copper Cu, titanium Ti and alloy thereof, and known metal layers for wiring, plug and metal contact layer.

As described above in detail, according to the present invention, there is provided an abrasive composition which is excellent in polishing selectivity against a metal layer and an insulating layer, polishes a metal layer at high rate, and has low α-ray radiation dose which will be a cause of soft error, by a simple method that an oxidizing agent and abrasive particles obtained by including cerium oxide in an oxide (i) selected from aluminum oxide and silicon oxide are mixed. The composition has extremely high industrial availability as an abrasive composition for surface treatment of a magnetic disk substrate and metal as well as for polishing of a metal layer on a semiconductor substrate.

The following Examples and Comparative Examples further illustrate the present invention in detail but are not to be construed to limit the scope thereof.

In Examples and Comparative Examples, the measurements were conducted according to the following methods.
Mean particle size:

A particle size at 50% cumulation was measured by a Micro track MK II particle size analyzer (SPA model 7997-20 manufactured by Nikkiso Co., Ltd.), and was recognized as mean particle size. The term "mean particle size" of the present invention means mean particle size of the secondary particles measured by this method.

BET specific surface area:

It was measured by a flow type specific surface area automatic measuring apparatus (Flow Sorb II 2300 PC-1A, manufactured by Shimadzu Corp.)

α-ray radiation dose:

When α-ray radiation dose is not less than 0.1 counts/$cm^2 \cdot hr$, it was measured by a α-ray radiation dose measuring apparatus(model ZDS-451, manufactured by Alloca Co., Ltd.), and when α-ray radiation dose is less than 0.1 counts/$cm^2 \cdot hr$, it was measured by a lower level α-ray radiation measuring apparatus (LACS-4000M, manufactured by Sumitomo Chemical Co., Ltd.).

EXAMPLE 1

T0 a slurry prepared by suspending 250 g of aluminum hydroxide having a mean particle size of 0.6 µm produced by hydrolysis of aluminum alkoxide in 940 ml of isopropyl alcohol, a solution prepared by dissolving 52.69 g (amount corresponding to 10 parts by weight in terms of cerium based on 100 parts by weight of aluminum oxide equivalent obtained from aluminum hydroxide used as a raw material) of cerium nitrate [$Ce(NO_3)_3 \cdot 6H_2O$] in 170 g of isopropyl alcohol was added dropwise, followed by mixing with stirring. The mixed solution was heated with refluxing for 2 hours, then dried by removing the solvent.

The resulting dried powder was calcined at 1050° C. for 3 hours. The crystalline form of the resulting aluminum oxide powder was recognized as γ-alumina by X ray diffraction. The mean particle size was 0.8 µm, the BET specific surface area was 56 $m^2/g$, and it was recognized by the result of element analysis by a transmission electron microscope (Model TEM-EDX) that each primary particle of the resulting aluminum oxide contained a cerium component.

9 g of the aluminum oxide powder containing cerium oxide thus obtained was dispersed in 141 g of water to make a slurry having a concentration of 6% by weight, and this slurry was wet-ground to obtain a polishing slurry. The secondary particles after wet-grinding had a mean particle size of 0.51 µm, and a BET specific surface area of 57 $m^2/g$. Then, to this polishing slurry was added 150 g of a 10% by weight aqueous solution of iron (III) nitrate 9 hydrate as an oxidizing agent, and they were mixed to prepare an abrasive composition. The mixing ratio by weight of the polishing slurry to the aqueous solution of iron (III) nitrate 9 hydrate was 1:1, the slurry concentration of the aluminum oxide powder containing cerium oxide was 3% by weight, and pH of the slurry was 1.1.

Using the resulting abrasive composition, a tungsten layer, titanium layer and silicon oxide layer were respectively polished. The tungsten layer and titanium layer (a thickness of these layers: about 0.8 µm respectively) were polished under conditions of a processing pressure of 300 $g/cm^2$ and a platen speed of 200 rpm, and SUBA 800 (trade name, manufactured by Rodel company) was used as a polishing pad. On the other hand, the silicon oxide layer (a thickness of the layer: about 1 µm) was polished under conditions of a processing pressure of 300 $g/cm^2$ and a platen speed of 140 rpm, and SUBA 800 (trade name, manufactured by Rodel company) was used as polishing pad. At any case, the polishing rate was measured, and surface condition after polishing, and an occurrence of defects were investigated. The mean particle size of the abrasive particle and composition abstract of the abrasive composition are shown in Table 1, and the results of the measurements are shown in Table 2.

Further, the α-ray radiation dose of the aluminum oxide powder containing cerium oxide used herein as an abrasive particle was measured to find it was 0.007 counts/$cm^2 \cdot hr$.

EXAMPLE 2

An aluminum oxide powder containing cerium oxide was obtained in the same manner as in Example 1, except that the amount of cerium nitrate was changed to 105.38 g (amount corresponding to 20 parts by weight in terms of cerium based on 100 parts by weight of aluminum oxide equivalent obtained from aluminum hydroxide used as a raw material). This aluminum oxide powder had a crystalline form of γ-alumina, and had a mean particle size of 0.8 µm, and a BET specific surface area of 51 $m^2/g$.

Using 9 g of the aluminum oxide powder containing cerium oxide thus obtained, 150 g of a polishing slurry was obtained in the same manner as in Example 1. The secondary particles after wet-grinding had a mean particle size of 0.53 µm, and a BET specific surface area of 56 $m^2/g$. To this polishing slurry was added 150 g of a 10% by weight aqueous solution of iron (III) nitrate 9 hydrate as an oxidizing agent, and they were mixed to obtain an abrasive composition. The mixing ratio by weight of the polishing slurry to the aqueous solution of iron (III) nitrate 9 hydrate herein was 1:1, the slurry concentration of the aluminum oxide powder containing cerium oxide was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

EXAMPLE 3

To 150 g of the same polishing slurry which had not contained the oxidizing agent yet as in Example 2 were added 97.05 g of 30% aqueous solution of hydrogen peroxide as an oxidizing agent and 52.95 g of water, then they were mixed, pH thereof was prepared to be 3.8 by adding of nitric acid to obtain an abrasive composition. The amount of added hydrogen peroxide herein was about 10% by volume based on the abrasive composition, and the slurry concentration of the aluminum oxide powder containing cerium oxide was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

EXAMPLE 4

To 150 g of the same polishing slurry which had not contained the oxidizing agent yet as in Example 2 were added 97.05 g of 30% aqueous solution of hydrogen peroxide as an oxidizing agent and 52.95 g of water, then they were mixed, pH thereof was prepared to be 7 by adding of nitric acid to obtain an abrasive composition. The amount of added hydrogen peroxide herein was about 10% by volume based on the abrasive composition, and the slurry concentration of the aluminum oxide powder containing cerium oxide was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

EXAMPLE 5

An aluminum oxide powder containing cerium oxide was obtained in the same manner as in Example 2 except that the calcination of the dried powder was conducted at 850° C. for 3 hours instead of 1050° C. for 3 hours in Example 2. This aluminum oxide powder had a crystalline form of amorphous material, and had a mean particle size of 2.1 µm, and a BET specific surface area of 128 $m^2/g$.

Using 9 g of the aluminum oxide powder containing cerium oxide thus obtained, 150 g of a polishing slurry was obtained in the same manner as in Example 1. The secondary particles after wet-grinding had a mean particle size of 0.39 µm, and a BET specific surface area of 129 $m^2/g$. To this polishing slurry was added 150 g of a 10% by weight aqueous solution of iron (III) nitrate 9 hydrate as an oxidizing agent, and they were mixed to obtain an abrasive composition. The mixing ratio by weight of the polishing slurry to the aqueous solution of iron (III) nitrate 9 hydrate herein was 1:1, the slurry concentration of the aluminum oxide powder containing cerium oxide was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

COMPARATIVE EXAMPLE 1

The same procedure as in Example 1 was conducted except that 9 g of a γ-alumina powder having a mean particle size of 0.40 µm and a BET specific surface area of 150 $m^2/g$ was used instead of the aluminum oxide powder containing cerium oxide in Example 1, to obtain 150 g of a polishing slurry. Into this polishing slurry was mixed 150 g of a 10% by weight aqueous solution of iron (III) nitrate 9 hydrate as an oxidizing agent to obtain an abrasive composition. The mixing ratio by weight of the polishing slurry to the aqueous solution of iron (III) nitrate 9 hydrate herein was 1:1, the slurry concentration of the γ-alumina powder was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

COMPARATIVE EXAMPLE 2

The same procedure as in Example 1 was conducted except that 9 g of an α-alumina powder having a mean particle size of 0.39 µm and a BET specific surface area of 25 $m^2/g$ was used instead of the aluminum oxide powder containing cerium oxide in Example 1, to obtain 150 g of a polishing slurry. Into this polishing slurry was mixed 150 g of a 10% by weight aqueous solution of iron (III) nitrate 9 hydrate as an oxidizing agent to obtain an abrasive composition. The mixing ratio by weight of the polishing slurry to the aqueous solution of iron (III) nitrate 9 hydrate herein was 1:1, the slurry concentration of the α-alumina powder was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

COMPARATIVE EXAMPLE 3

The same procedure as in Example 1 was conducted except that a mixed powder consisting of (i) 7.2 g of a γ-alumina powder having a mean particle size of 0.40 µm and a BET specific surface area of 150 $m^2/g$ and (ii) 1.8 g (amount corresponding to 20% by weight in terms of cerium based on γ-alumina) of a cerium oxide powder having a mean particle size of 0.3 µm and a BET specific surface area of 105.5 $m^2/g$ was used instead of the aluminum oxide powder containing cerium oxide in Example 1, to obtain 150 g of a polishing slurry. Into this polishing slurry was mixed 150 g of a 10% by weight aqueous solution of iron (III) nitrate 9 hydrate to obtain an abrasive composition. The mixing ratio by weight of the polishing slurry to the aqueous solution of iron (III) nitrate 9 hydrate herein was 1:1, the slurry concentration of the mixed powder was 3% by weight, and the pH of the slurry was 1.1.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

COMPARATIVE EXAMPLE 4

9 g of the aluminum oxide powder containing cerium oxide obtained in Example 2 was dispersed in 291 g of water to obtain a 3% by weight of slurry. This slurry was wet-ground and pH thereof was prepared to be 1.1 by adding of nitric acid to obtain a polishing slurry.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

COMPARATIVE EXAMPLE 5

An aluminum oxide powder containing cerium oxide was obtained in the same manner as in Example 1 except that the amount of cerium nitrate was changed to 15.81 g (amount of corresponding to 3 parts by weight in terms of cerium based on aluminum oxide equivalent). This powder had a crystalline form of γ-alumina, and had a mean particle size of 0.9 µm, and a BET specific surface area of 55 $m^2/g$.

Using 9 g of the aluminum oxide powder containing cerium oxide thus obtained, 150 g of a polishing slurry was obtained in the same manner as in Example 1. To this polishing slurry was added 150 g of a 10% by weight aqueous solution of iron (III) nitrate 9 hydrate as an oxidizing agent, and they were mixed to obtain an abrasive composition. The mixing ratio by weight of the polishing slurry to the aqueous solution of iron (III) nitrate 9 hydrate herein was 1:1, the slurry concentration of the aluminum oxide powder containing cerium oxide was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

COMPARATIVE EXAMPLE 6

An aluminum oxide powder containing cerium oxide was obtained in the same manner as in Example 1 except that aluminum hydroxide having a mean particle size of 2.1 μm was used instead of aluminum hydroxide having a mean particle size of 0.6 μm. This powder had a crystalline form of γ-alumina, and had a mean particle size of 2.5 μm, and a BET specific surface area of 82 m²/g.

Using 9 g of the aluminum oxide powder containing cerium oxide thus obtained, 150 g of a polishing slurry was obtained in the same manner as in Example 1. To this polishing slurry was added 150 g of a 10% by weight aqueous solution of iron (III) nitrate 9 hydrate as an oxidizing agent, and they were mixed to obtain an abrasive composition. The mixing ratio by weight of the polishing slurry to the aqueous solution of iron (III) nitrate 9 hydrate herein was 1:1, the slurry concentration of the aluminum oxide powder containing cerium oxide was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

COMPARATIVE EXAMPLE 7

150 g of a polishing slurry was obtained in the same manner as in Example 1 except that 9 g of a cerium oxide powder having a mean particle size of 3.5 μm and a BET specific surface area of 5.8 m²/g was used instead of the aluminum oxide powder containing cerium oxide. Into this polishing slurry was mixed 150 g of a 10% by weight aqueous solution of iron (III) nitrate 9 hydrate as an oxidizing agent, and they were mixed to obtain an abrasive composition. The mixing ratio by weight of the polishing slurry to the aqueous solution of iron (III) nitrate 9 hydrate herein was 1:1, and the slurry concentration of the cerium oxide powder was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

Further, the α-ray radiation dose of the cerium oxide powder used herein as an abrasive particle was measured to find it was 250 counts/cm²•hr.

COMPARATIVE EXAMPLE 8

To 150 g of the polishing slurry which is obtained in the same manner as in Example 2 were added 97.05 g of 30% aqueous solution of hydrogen peroxide as an oxidizing agent and 52.95 g of water, then they were mixed, pH thereof was prepared to be 9 by adding of nitric acid to obtain an abrasive composition. The amount of added hydrogen peroxide herein was about 10% by volume based on the abrasive composition, and the slurry concentration of the aluminum oxide powder containing cerium oxide was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

COMPARATIVE EXAMPLE 9

150 g of a polishing slurry was obtained in the same manner as in Example 1 except that a γ-alumina powder having a mean particle size of 0.40 μm and a BET specific surface area of 150 m²/g was used instead of the aluminum oxide powder containing cerium oxide. Into this polishing slurry was mixed 97.05 g of 30% aqueous solution of hydrogen peroxide as an oxidizing agent and 52.95 g of water, then they were mixed, and pH thereof was prepared to be 3.8 by adding of nitric acid to obtain an abrasive composition. The amount of added hydrogen peroxide was about 10% by volume based on the abrasive composition, and the slurry concentration of the γ-alumina powder was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

COMPARATIVE EXAMPLE 10

150 g of a polishing slurry was obtained in the same manner as in Example 1 except that 9 g of an α-alumina powder having a mean particle size of 0.39 μm and a BET specific surface area of 25 m²/g was used instead of the aluminum oxide powder containing cerium oxide. Into this polishing slurry was mixed 97.05 g of 30% aqueous solution of hydrogen peroxide as an oxidizing agent and 52.95 g of water, then they were mixed, and pH thereof was prepared to be 3.8 by adding of nitric acid to obtain an abrasive composition. The amount of added hydrogen peroxide was about 10% by volume based on the abrasive composition, and the slurry concentration of the α-alumina powder was 3% by weight.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

COMPARATIVE EXAMPLE 11

9 g of the aluminum oxide powder containing cerium oxide which is obtained in the same manner as in Example 2 was dispersed in 291 g of water to obtain a 3% by weight of slurry, and this slurry was wet-ground, pH thereof was prepared to be 3.8 by adding of nitric acid to obtain a polishing slurry.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

COMPARATIVE EXAMPLE 12

9 g of the aluminum oxide powder containing cerium oxide which is obtained in the same manner as in Example 5 was dispersed in 291 g of water to obtain a 3% by weight of slurry, and this slurry was wet-ground, pH thereof was prepared to be 1.1 by adding of nitric acid to obtain a polishing slurry.

Using the resulting abrasive composition, a tungsten layer, titanium layer and silicon oxide layer were respectively polished in the same manner as in Example 1. The mean particle size of the abrasive particle and composition abstract of the abrasive composition are shown in Table 1, and the results of the measurements are shown in Table 2.

TABLE 1

| | Abrasive particles | Mean particle size | Content of cerium(*) | Oxidizing agent | pH of a slurry |
|---|---|---|---|---|---|
| Example | 1 aluminum oxide containing cerium oxide | 0.5 μm | 10 wt % | $Fe(NO_3)_3$ | 1.1 |
| | 2 aluminum oxide containing cerium oxide | 0.5 μm | 20 wt % | $Fe(NO_3)_3$ | 1.1 |
| | 3 aluminum oxide containing cerium oxide | 0.5 μm | 20 wt % | $H_2O_2$ | 3.8 |
| | 4 aluminum oxide containing cerium oxide | 0.5 μm | 20 wt % | $H_2O_2$ | 7 |
| | 5 amorphous aluminum oxide containing cerium oxide | 0.4 μm | 20 wt % | $Fe(NO_3)_3$ | 1.1 |
| Comparative Example | 1 γ-alumina | 0.4 μm | None | $Fe(NO_3)_3$ | 1.1 |
| | 2 α-alumina | 0.4 μm | None | $Fe(NO_3)_3$ | 1.1 |
| | 3 a mixture of γ-alumina and cerium oxide | 0.4–0.3 μm | 20 wt % | $Fe(NO_3)_3$ | 1.1 |
| | 4 aluminum oxide contaning cerium oxide | 0.5 μm | 20 wt % | None | 1.1 |
| | 5 aluminum oxide containing cerium oxide | 0.9 μm | 3 wt % | $Fe(NO_3)_3$ | 1.1 |
| | 6 aluminum oxide containing cerium oxide | 2.5 μm | 10 wt % | $Fe(NO_3)_3$ | 1.1 |
| | 7 cerium oxide | 3.5 μm | $CeO_2$ only | $Fe(NO_3)_3$ | 1.1 |
| | 8 aluminum oxide containing cerium oxide | 0.5 μm | 20 wt % | $H_2O_2$ | 9 |
| | 9 γ-alumina | 0.4 μm | None | $H_2O_2$ | 3.8 |
| | 10 α-alumina | 0.4 μm | None | $H_2O_2$ | 3.8 |
| | 11 a mixture of γ-alumina and cerium oxide | 0.5 μm | 20 wt % | None | 3.8 |
| | 12 amorphous aluminum oxide containing cerium oxide | 0.4 μm | 20 wt % | None | 1.1 |

(*): based on aluminum oxide

TABLE 2

| | | Tungsten layer | | Titanium layer | Silicon oxide layer | |
|---|---|---|---|---|---|---|
| | | Polishing rate[1] (Å/min) | Surface appearance[2] | Polishing rate[1] (Å/min) | Polishing rate[3] (Å/min) | Surface appearance[2] |
| Example | 1 | 4700 | Mirror surface | 900 | 15 | No defect |
| | 2 | 7500 | Mirror surface | 1400 | 10 | No defect |
| | 3 | 3000 | Mirror surface | 1400 | 18 | No defect |
| | 4 | 3500 | Mirror surface | 1000 | 25 | No defect |
| | 5 | 7500 | Mirror surface | 1100 | 10 | No defect |
| Comparative Example | 1 | 1700 | Mirror surface | 320 | 45 | No defect |
| | 2 | 7500 | Mirror surface | 1600 | 40 | Some scratches are observed |
| | 3 | 2000 | Mirror surface | 350 | 36 | No defect |
| | 4 | 190 | Mirror surface | 350 | 40 | No defect |
| | 5 | 2000 | Mirror surface | 670 | 15 | No defect |
| | 6 | 4500 | Mirror surface | 800 | 18 | Some scratches are observed |
| | 7 | 6000 | Mirror surface | 600 | 25 | Some scratches are observed |
| | 8 | 4000 | Non-mirror surface | 700 | 80 | No defect |
| | 9 | 840 | Mirror surface | 500 | 54 | No defect |
| | 10 | 5500 | Mirror surface | 3500 | 81 | Some scratches are observed |
| | 11 | 200 | Mirror surface | 360 | 54 | No defect |
| | 12 | 180 | Mirror surface | 350 | 40 | No defect |

In the tables,
1) The polishing rate was shown based on decrease in thickness of the polished layer by way of measurement of decrease in weight of the layer.
2) "Mirror surface" indicates the surface condition which can reflect an object on the metal surface like a mirror when observed by an optical microscope, and "Non-mirror surface" indicates the surface condition which can not reflect an object on the metal surface like a mirror since the metal surface is rough.
3) The polishing rate was shown based on decrease in thickness of the polished layer, measured by layer thickness measuring apparatus (MCPD-2000, manufactured by Otsuka Electronics Corp.)

Table 2 shows that the abrasive composition of the present invention polishes a metal layer such as a tungsten layer and a titanium layer formed on a semiconductor substrate at high polishing rate without causing defects such as micro scratch and orange peel on the surface of the metal layer, although the composition polishes an insulating layer only at low polishing rate. The composition also polishes the insulating layer without causing defects on the surface of the insulating layer. This indicates the composition has excellent polishing selectivity against a metal layer and an insulating layer without causing defects on the surface of both the metal layer and the insulating layer and does not unnecessarily polish the insulating layer. From the results of Example 1, it is known that the abrasive composition of the present invention has extremely low α-ray radiation dose which will be a cause of soft error.

BRIEF DESCRIPTION OF THE DRAWINGS

FIG. 1 is a polishing apparatus using the CMP method. Here, letter (a) indicates a wafer, letter (b) indicates a polishing pad, letter (c) indicates a wafer carrier, letter (d) indicates a polishing platen and letter (e) indicates a polishing composition respectively.

FIG. 2 is a sectional view showing one example for forming an embedded metal wiring board using the conventional CMP method. Here, number 1 indicates a semiconductor substrate, number 2 indicates an insulating layer, number 3 indicates a metal contact layer, number 4 indicates an adhesion layer and number 5 indicates a metal layer for wiring, respectively.

What is claimed is:

1. An abrasive composition comprising an oxidizing agent and abrasive particles which have a mean particle size of 2 $\mu$m or less, wherein the abrasive particles comprise (i) at least one oxide selected from aluminum oxide and silicon oxide and (ii) cerium oxide in an amount of 5% to 40% by weight in terms of cerium based on the oxide (i).

2. An abrasive composition according to claim 1, wherein the abrasive particles have a BET specific surface area of from about 40 m$^2$/g to about 150 m$^2$/g.

3. An abrasive composition according to claim 1, wherein the oxide (i) is aluminum oxide.

4. An abrasive composition according to claim 3, wherein the aluminum oxide is transition alumina, amorphous alumina or a mixture thereof.

5. An abrasive composition according to any one of claims 1 to 3, wherein the oxidizing agent is at least one oxidizing agent selected from hydrogen peroxide, iron (III) nitrate, iodic acid, iodate, perchloric acid and perchlorate.

6. An abrasive composition according to claim 1, wherein the abrasive particles are obtained by a method which comprises suspending in a solvent at least one compound selected from aluminum oxide having a mean particle size of 2 $\mu$m or less, silicon oxide having a mean particle size of 2 $\mu$m or less, and a precursor of aluminum oxide or silicon oxide which is converted by calcining to aluminum oxide or silicon oxide having a mean particle size of 2 $\mu$m or less, to prepare a suspension; mixing a cerium compound with the suspension wherein the cerium compound is converted by calcining to cerium oxide; drying the suspension; and calcining it.

7. An abrasive composition according to claim 6, wherein the cerium compound which is converted to cerium oxide by calcining is at least one cerium compound selected from cerium nitrate, cerium acetate, cerium sulfate, cerium oxalate, cerium ammonium salt and cerium carbonate.

8. A slurry comprising an abrasive composition according to claim 1 dispersed in water.

9. A slurry according to claim 8, which has a pH of about 7 or less.

10. A slurry according to claim 9, which has a pH of about 5 or less.

11. A slurry according to claim 8, wherein the content of abrasive particles is from 1% to 30% by weight based on the slurry.

12. A method of polishing and planarizing a metal layer on a semiconductor substrate in which the metal layer is polished and planarized at a pH of about 7 or less, using an abrasive composition comprising an oxidizing agent and abrasive particles which have a mean particle size of 2 $\mu$m or less, wherein the abrasive particles comprise (i) at least one oxide selected from aluminum oxide and silicon oxide and (ii) cerium oxide in an amount of 5% to 40% by weight in terms of cerium based on the oxide (i) in the presence of water.

13. A method according to claim 12, wherein the oxidizing agent is at least one oxidizing agent selected from hydrogen peroxide, iron nitrate, iodic acid, iodate, perchloric acid and perchlorate.

14. A method according to claim 12 or 13, wherein the pH is about 5 or less.

* * * * *